United States Patent
Calafut et al.

(10) Patent No.: US 9,190,478 B2
(45) Date of Patent: Nov. 17, 2015

(54) METHOD FOR FORMING DUAL OXIDE TRENCH GATE POWER MOSFET USING OXIDE FILLED TRENCH

(71) Applicant: Alpha and Omega Semiconductor Incorporated, Sunnyvale, CA (US)

(72) Inventors: Daniel Calafut, San Jose, CA (US); Madhur Bobde, Santa Clara, CA (US); Yeeheng Lee, San Jose, CA (US); Hong Chang, Cupertino, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 8 days.

(21) Appl. No.: 14/138,103

(22) Filed: Dec. 22, 2013

(65) Prior Publication Data

US 2015/0179750 A1    Jun. 25, 2015

(51) Int. Cl.
*H01L 21/336* (2006.01)
*H01L 21/311* (2006.01)
*H01L 29/423* (2006.01)
*H01L 29/78* (2006.01)
*H01L 29/66* (2006.01)

(52) U.S. Cl.
CPC .... *H01L 29/42368* (2013.01); *H01L 29/66666* (2013.01); *H01L 29/7827* (2013.01)

(58) Field of Classification Search
None
See application file for complete search history.

(56) References Cited

U.S. PATENT DOCUMENTS

| | | | |
|---|---|---|---|
| 5,763,915 A * | 6/1998 | Hshieh et al. | 257/330 |
| 2002/0094649 A1 * | 7/2002 | Arthanari et al. | 438/296 |
| 2003/0042546 A1 * | 3/2003 | Abbott | 257/368 |
| 2011/0037120 A1 * | 2/2011 | Chen et al. | 257/331 |
| 2011/0049618 A1 * | 3/2011 | Lee et al. | 257/330 |
| 2011/0057259 A1 * | 3/2011 | Li | 257/333 |
| 2012/0217612 A1 * | 8/2012 | Baars et al. | 257/508 |

OTHER PUBLICATIONS

U.S. Appl. No. 13/766,523.

* cited by examiner

*Primary Examiner* — Mamadou Diallo
*Assistant Examiner* — Jay C Chang
(74) *Attorney, Agent, or Firm* — Van Pelt, Yi & James LLP

(57) ABSTRACT

A method for forming a dual oxide thickness trench gate structure for a power MOSFET includes providing a semiconductor substrate; forming a first trench on a top surface of the substrate; forming a first oxide layer in the first trench where the first oxide layer has a first depth from the bottom of the first trench; forming a dielectric spacer along the sidewall of the first trench and on the first oxide layer; etching the first oxide layer exposed by the dielectric spacer to a second depth from the bottom of the first trench using the dielectric spacer as a mask where the second depth is lower than the first depth; removing the dielectric spacer; and forming a second oxide layer along the sidewall of the first trench above the first oxide layer where the second oxide layer has a thickness thinner than the thickness of the first oxide layer.

8 Claims, 10 Drawing Sheets

METHOD FOR FORMING DUAL OXIDE TRENCH GATE POWER MOSFET USING OXIDE FILLED TRENCH

BACKGROUND OF THE INVENTION

Power metal-oxide-silicon field-effect transistors (MOSFET) are employed in applications requiring high voltages and high currents. One type of Power MOSFETs uses a trench gate structure where the transistor gate is provided in a vertical trench formed at the surface of the substrate. The trench gate is isolated from the substrate by a gate oxide layer lining the sidewall and the base of the trench. The source and body regions are formed adjacent the trench at the surface of the substrate and the drain region is formed on the opposite surface of the substrate. As thus configured, the channel of the transistor is formed in body region along the vertical sidewall of the trench. Power MOSFETs using a trench gate are sometimes referred to as trench MOSFETs, or trench gate power MOSFETs, or trench-gated vertical power MOSFET.

In some applications, trench gate power MOSFET devices benefit from using a dual oxide thickness trench gate structure. In a dual oxide thickness trench gate structure, the trench gate is formed in a trench lined with a liner oxide layer at a bottom portion of the trench that is thicker than the thin gate oxide layer at the top portion of the trench. FIG. 1 duplicates FIG. 3N of commonly assigned U.S. patent application Ser. No. 13/776,523 and illustrates an example of a dual oxide thickness trench gate structure for a trench gate power MOSFET device. U.S. patent application Ser. No. 13/776,523 is entitled "Termination Trench For Power MOSFET Applications," filed Feb. 25, 2013, and is incorporated herein by reference in its entirety. Conventional fabrication processes for forming the dual oxide thickness trench gate structure involve forming a trench in the silicon substrate to a first depth, forming a nitride spacer on the sidewalls of the trench, and then etching the silicon substrate in the trench further to a second depth using the nitride spacer as a self-aligned mask. Then, the conventional processes perform thermal oxidation to grow the liner oxide layer at the bottom portion of the trench. The nitride spacer is removed and thermal oxidation is performed to grow the gate oxide layer at the top portion of the trench.

Challenges exist in forming the dual oxide thickness trench gate structure. For example, particle debris may become lodged in the bottom of the trench during the second trench etch process. The particle debris inhibits the liner oxidation and causes shorts between the trench gate and the silicon substrate.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

In embodiments of the present invention, a method for forming a dual oxide thickness trench gate structure for a power MOSFET device involves providing a trench that is partially filled with an oxide layer, forming a nitride spacer above the oxide layer in the trench, and using the nitride spacer as a self-aligned mask to etch the partially filled oxide layer. The remaining portion of the oxide layer not etched becomes the liner oxide layer at the bottom portion of the trench. As thus configured, the trench structure is formed using a single trench etch in the silicon substrate. Furthermore, the liner oxide is formed by masking and etching instead of thermal oxidation which provides greater control of the thickness of the liner oxide. Also, the oxide layer fills the bottom portion of the trench and thereby protects the trench from contamination debris from subsequent etching process. Lastly, by eliminating the thermal oxidation process for the liner oxide, the total thermal budget of the power MOSFET fabrication process is decreased. It is thus possible to change the thickness of the line oxide layer without altering the thermal budget of the entire process.

Figure 1:
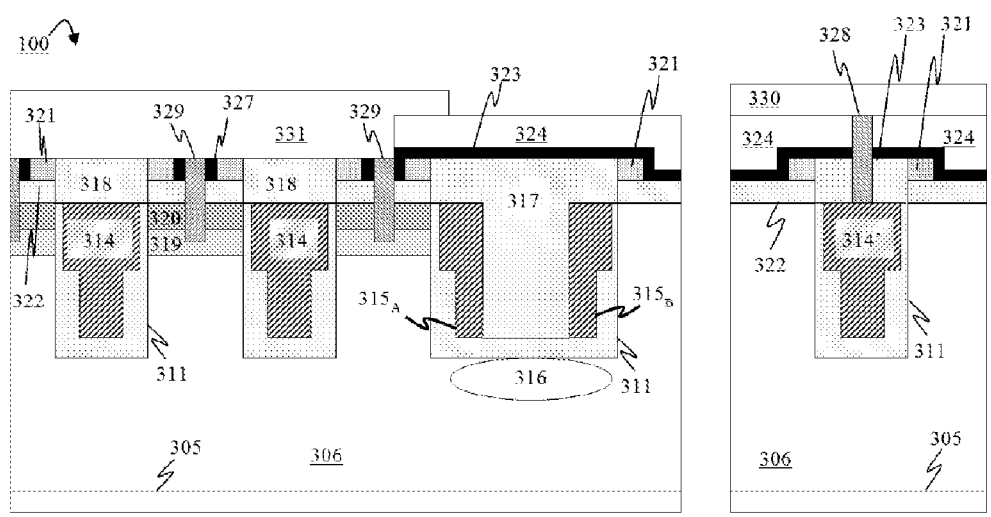
FIG. 1 duplicates FIG. 3N of commonly assigned U.S. patent application Ser. No. 13/776,523 and illustrates an example of a dual oxide thickness trench gate structure for a trench gate power MOSFET device.
Figure 2:
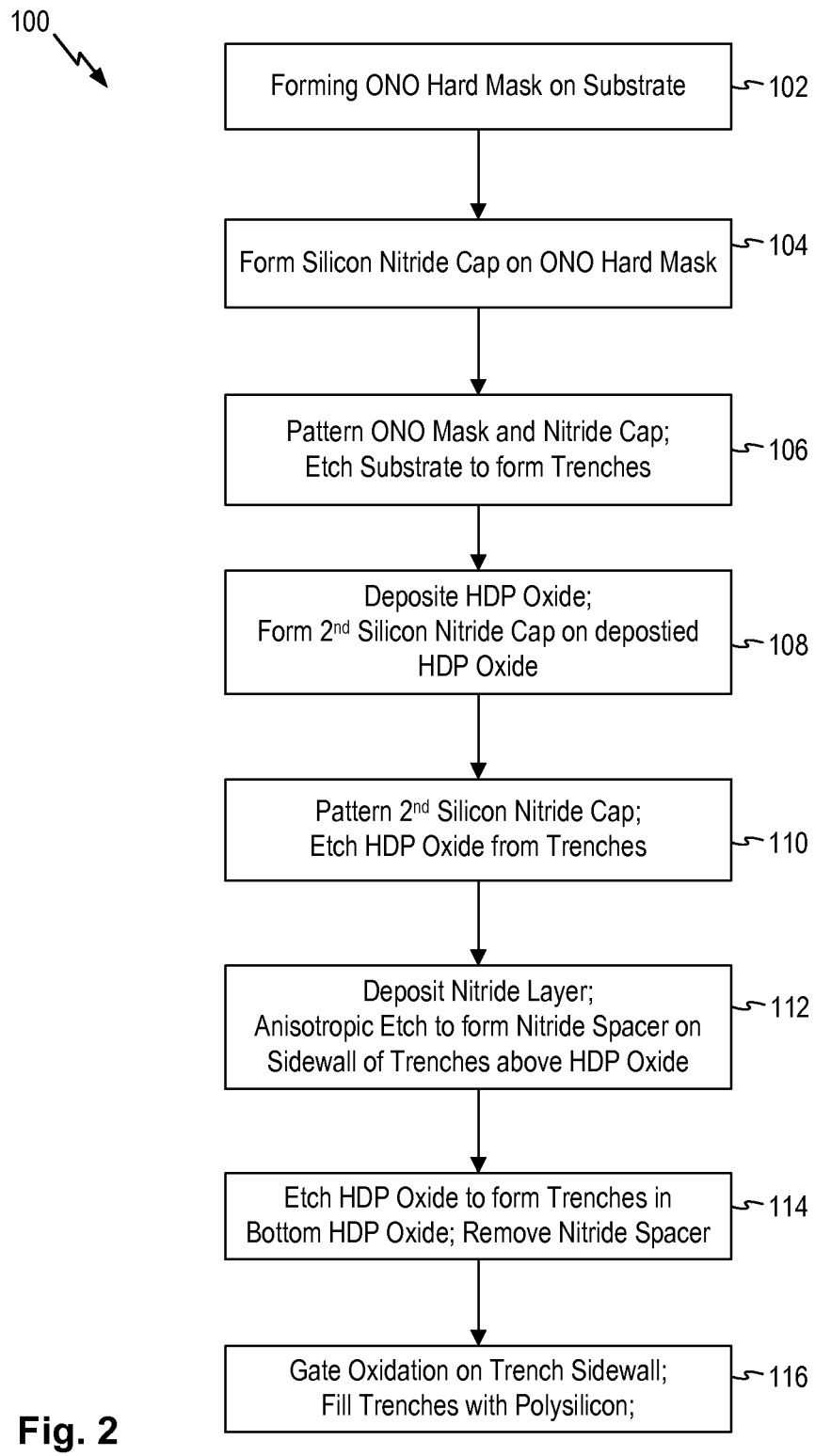
FIG. 2 is a flow chart illustrating a method for forming a dual oxide thickness trench gate structure in a power MOSFET according to one embodiment of the present invention.
Figure 3A:
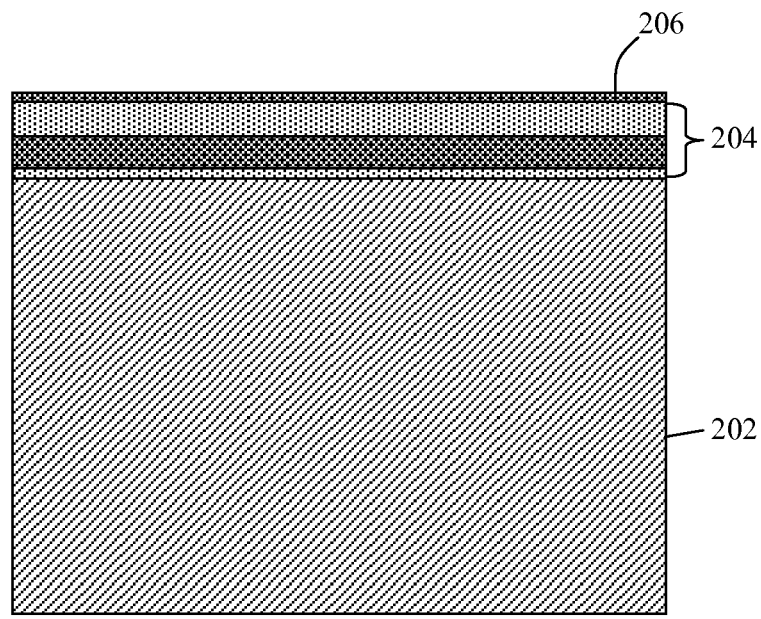
FIGS. 3(a) to 3(m) are cross-sectional views of a trench gate power MOSFET device illustrating the processing steps for forming the dual oxide thickness trench gate structure according to embodiments of the present invention.

FIG. 2 is a flow chart illustrating a method for forming a dual oxide thickness trench gate structure in a power MOSFET according to one embodiment of the present invention. The process shown in the flow chart of FIG. 2 will be described with reference to FIGS. 3(a) to 3(m) which are cross-sectional views of a trench gate power MOSFET device illustrating the processing steps for forming the dual oxide thickness trench gate structure according to embodiments of the present invention. In embodiments of the present invention, the power MOSFET device is formed in a semiconductor substrate 202, as shown in FIG. 3(a). The semiconductor substrate 202 may be an N-type substrate or a P-type substrate. In the present embodiment, it is assumed that the power MOSFET is an N-type transistor and the substrate 202 is thus an N-type silicon substrate. The substrate 202 forms a lightly doped drift region of the power MOSFET device. A heavily doped drain contact region (not shown) may be formed on the bottom portion of the semiconductor substrate 202.

Referring to FIG. 2, a method 100 for forming a dual oxide thickness trench gate structure in the power MOSFET device starts at 102 by forming an oxide-nitride-oxide (ONO) hard mask layer 204 on the top of the substrate 202. In one example, the ONO hard mask layer 204 may include a bottom oxide layer of 250 Å, a nitride layer of 1400 Å and a top oxide layer of 1400 Å. Then, at 104, a first silicon nitride cap layer 206 ("first nitride cap layer") is formed on the ONO hard mask layer 204. In other embodiments, the first nitride cap layer 206 may be formed using other suitable dielectric materials.

Figure 3B:
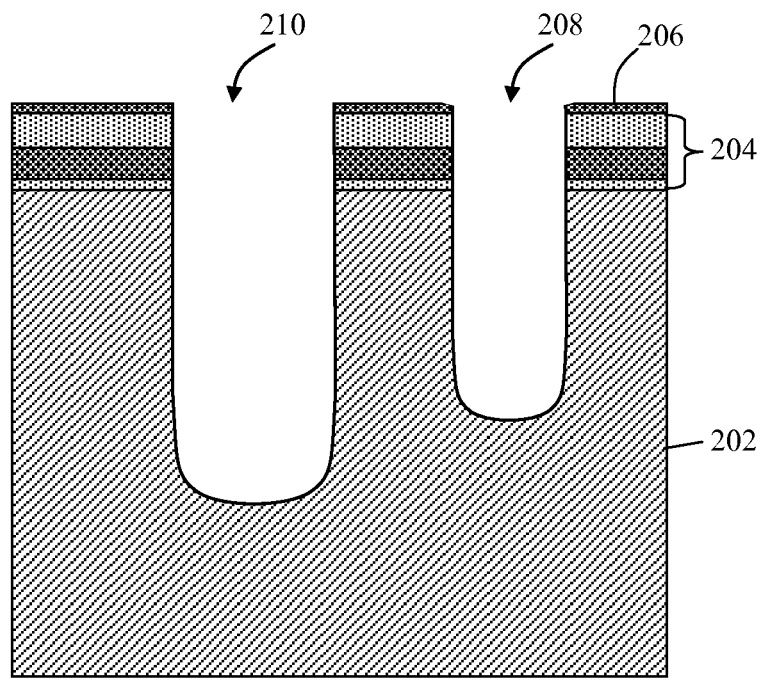

At 106, the ONO hark mask layer 204 and the first nitride cap layer 206 is patterned, such as using a trench mask, to define areas where trenches are to be formed. The first nitride cap layer 206 and the ONO hard mask layer 204 are removed to expose the top surface of the substrate 202 where trenches are to be formed. Then, the substrate 202 is etched to form trenches 208 and 210, as shown in FIG. 3(b). Trench 208 is formed in an active region of the power MOSFET device and is used to form an active cell of the power MOSFET device. Trench 210 is a termination trench formed outside of the active region around the edge of the semiconductor substrate 202 and is used to form a termination structure of the power MOSFET device. In the present illustration, the termination trench 210 has a wider width and a deeper depth than the active trench 208.

Figure 3C:
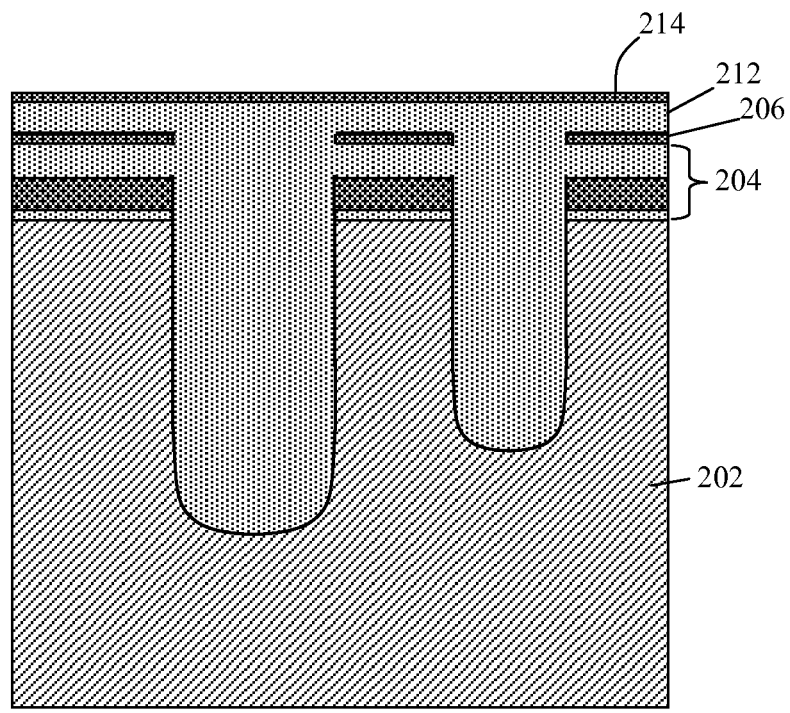

At 108, an oxide layer 212 is deposited onto the semiconductor structure of FIG. 3(b). In particular, the oxide layer 212 is deposited into the trenches 208, 210 and also over the top surface of the first nitride cap layer 206, as shown in FIG. 3(c). In one embodiment, the oxide layer 212 is a high density plasma (HDP) oxide layer. In other embodiments, other types of deposited oxide layer may be used. Then, a second silicon nitride cap layer 214 ("second nitride cap layer") is formed on the top surface of the deposited oxide layer 212, as shown in FIG. 3(c).

Figure 3D:
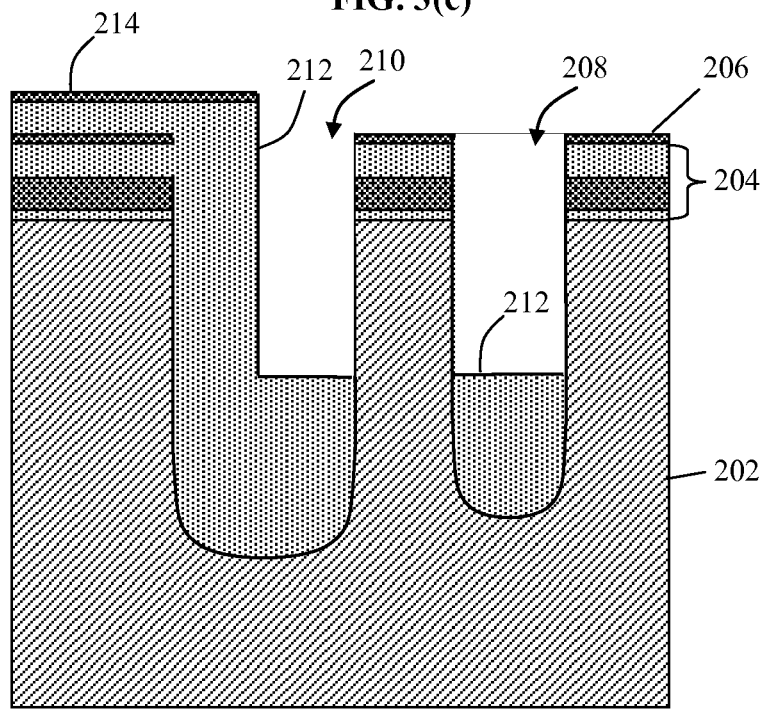

At 110, the second nitride cap layer 214 is patterned to define areas where the trench gate is to be formed subsequently. In other words, the second nitride cap layer 214 is patterned to define areas or trenches which will receive the polysilicon deposition subsequently. In one embodiment, the second nitride cap layer 214 is patterned by a polysilicon cover mask and the second nitride cap layer 214 is removed from areas that will receive the polysilicon deposition. With the second nitride cap layer 214 thus patterned and using the second nitride cap layer 214 as a mask, the oxide layer 212 is etched. After the oxide etch process, the oxide layer 212 within the active trench 208 is removed to a first depth d1, as shown in FIG. 3(d). At the termination trench 210, the second nitride cap layer 214 extends partially over the trench opening so that only a portion of the oxide layer 212 is removed from the termination trench 212. A thick sidewall of oxide layer 212 remains under the overhanging portion of the second nitride cap layer 214, as shown in FIG. 3(d). The thick oxide sidewall in the termination trench 210 provides isolation and edge termination functions.

Figure 3E:
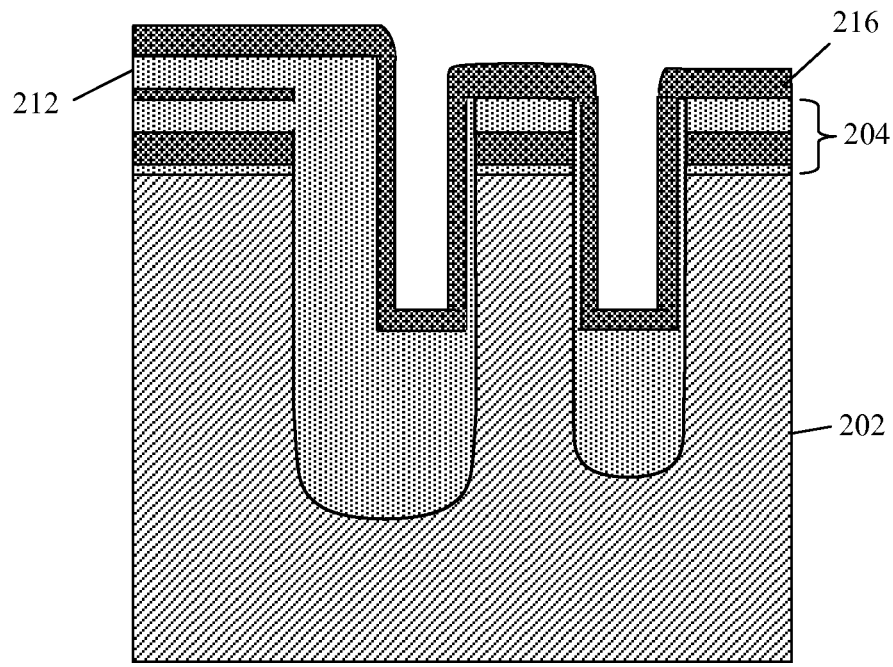
Figure 3F:
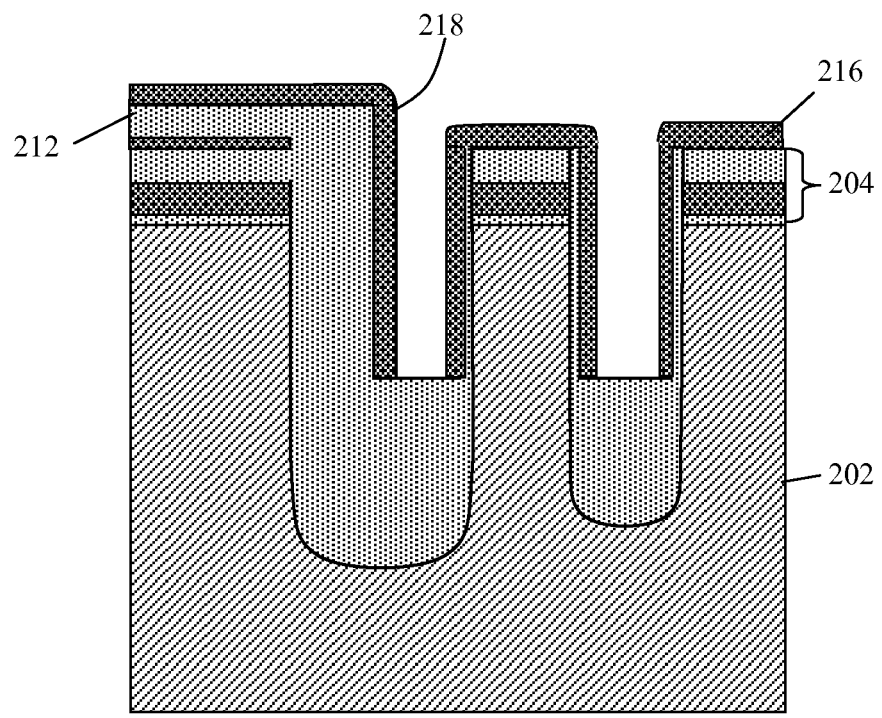

At 112, a pad oxide layer is grown on the exposed silicon surface. Then, a conformal silicon nitride layer 216 is deposited over the semiconductor structure, as shown in FIG. 3(e). The conformal silicon nitride layer 216 is anisotropically etched so that nitride spacers 218 are formed along the sidewalls of the trenches 208, 210, as shown in FIG. 3(f). The nitride spacers 218 thus formed are positioned above the oxide layer 212. The anisotropic etching removes the nitride layer 216 and exposes a portion of the oxide layer 212 between the nitride spacers 218.

Figure 3G:
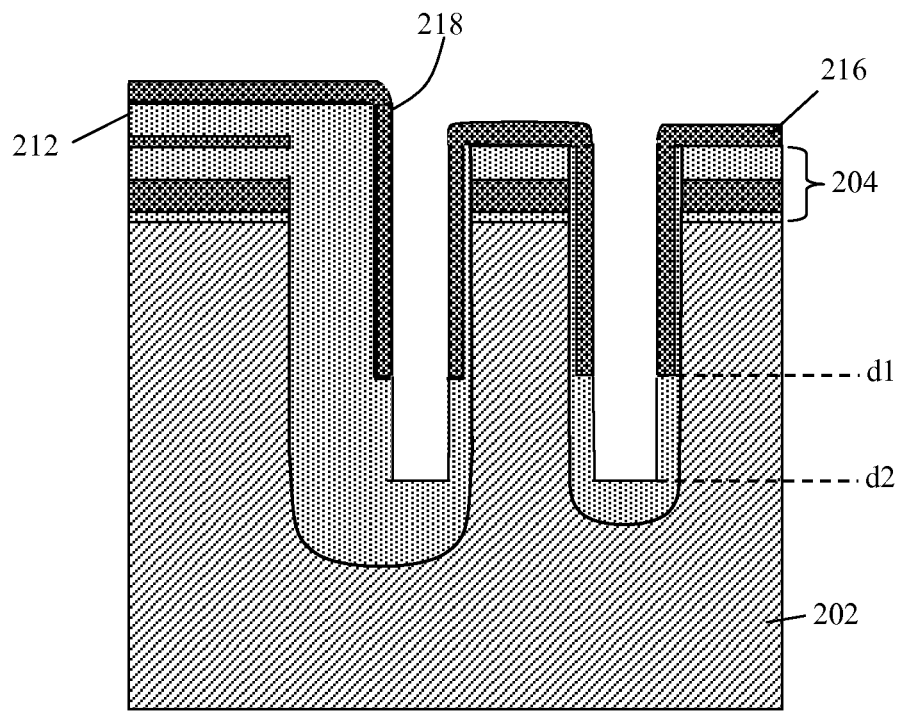
Figure 3H:
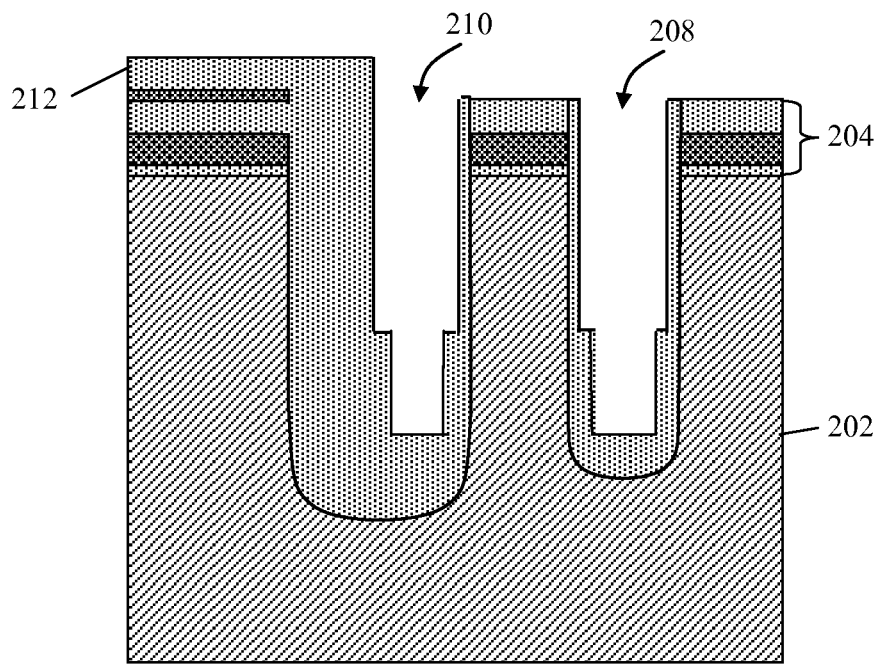

At 114, the exposed oxide layer 212 in the trenches 208, 210 is etched to a second depth d2, as shown in FIG. 3(g). Meanwhile, the oxide layer 212 that is protected by the nitride spacers 218 and the bottom portion of the oxide layer 212 in the trench remain to form the liner oxide layer. Then the nitride spacers 218 are removed. The resulting oxide thickness trench structure is shown in FIG. 3(h). In other words, the nitride spacers 218 are used to etch trenches in the oxide layer 212 so as to form the liner oxide layer in the bottom portion of the trenches.

Figure 3I:
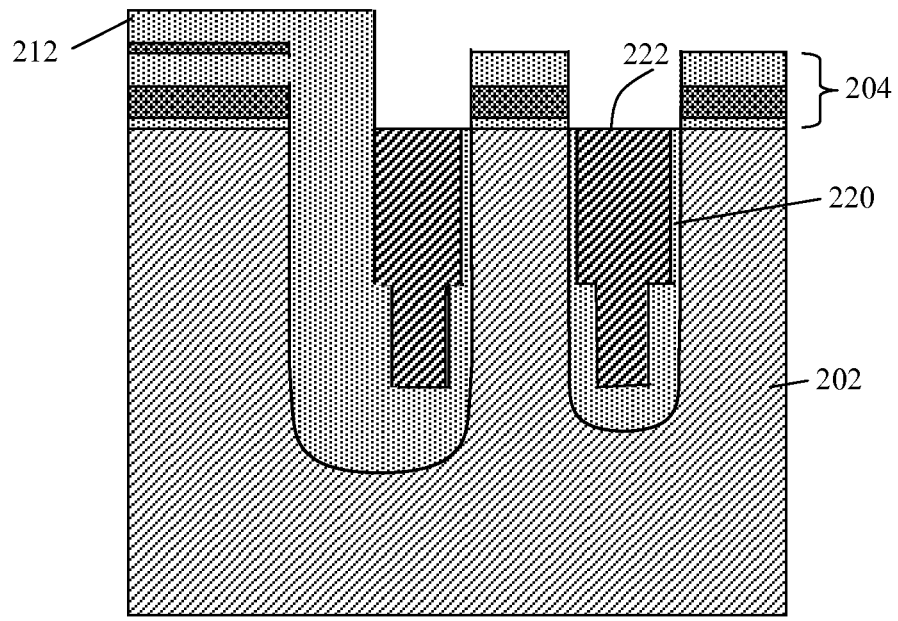

At 116, the pad oxide layer is removed and gate oxidation is performed on the semiconductor structure of FIG. 3(h) to grow a gate oxide layer 220 on the sidewalls of the trenches 208, 210. The gate oxide layer is primarily formed on the exposed silicon trench sidewalls above the liner oxide layer. The trenches 208, 210 are then filled with a polysilicon layer 222, as shown in FIG. 3(i). The polysilicon layer forming the gate electrode of the power MOSFET to be formed.

As thus configured and shown in FIG. 3(i), a dual oxide thickness trench gate structure is formed where a polysilicon trench gate is formed in a trench and is isolated from the silicon substrate by a thin gate oxide layer formed in an upper portion of the trench and a thicker liner oxide layer formed in the bottom portion of the trench. The thicker liner oxide is formed by etching of an oxide layer formed in the trench. The bottom portion of the trench is protected by the oxide layer during the etching process so that any etch debris that may fall into the trench during etching will land on the oxide layer and therefore isolated from the substrate and will not cause device failure. Furthermore, the sidewall thickness of the liner oxide layer is determined by the thickness of the conformal nitride layer used to form the nitride spacers. Thus, the thickness of the liner oxide layer can be well controlled and also can be varied without disturbing the thermal budget of the fabrication process. The bottom thickness of the liner oxide layer is determined by the oxide etch process and can be precisely controlled.

Figure 3J:
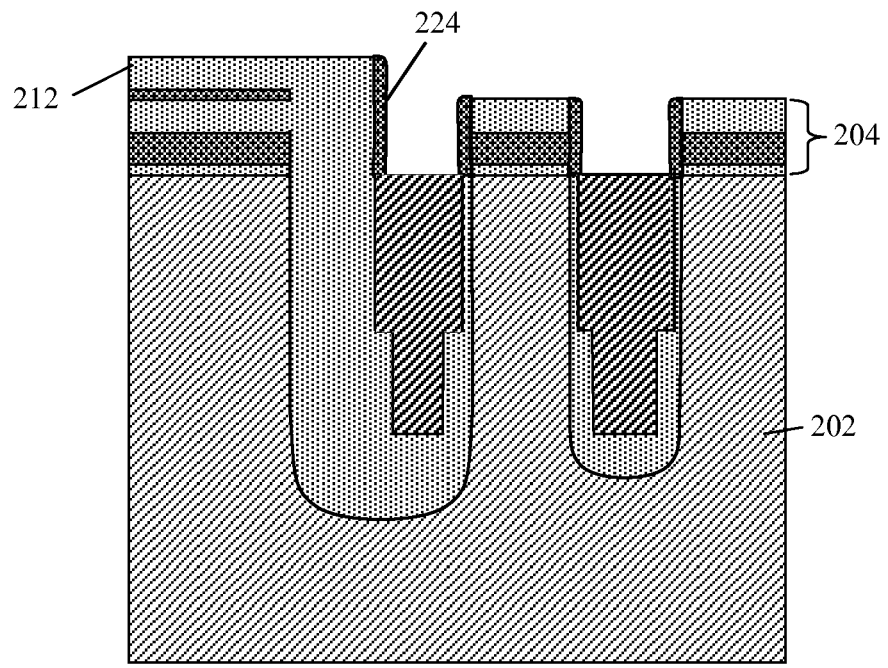
Figure 3K:
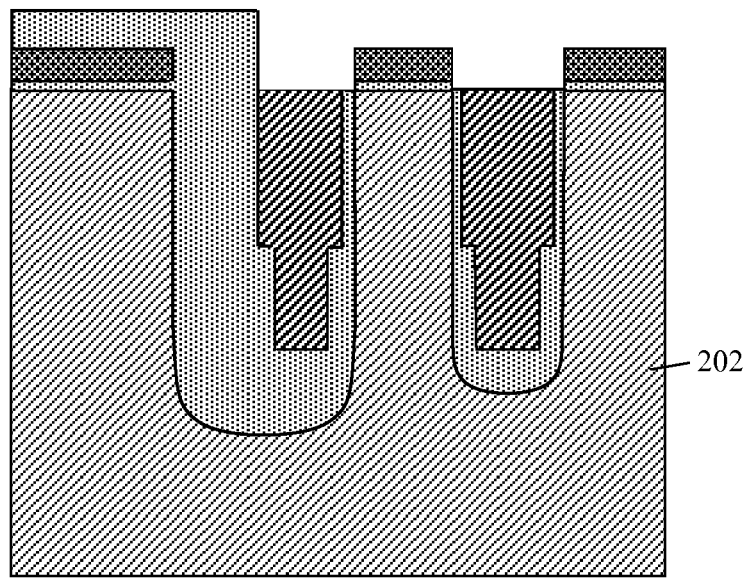
Figure 3L:
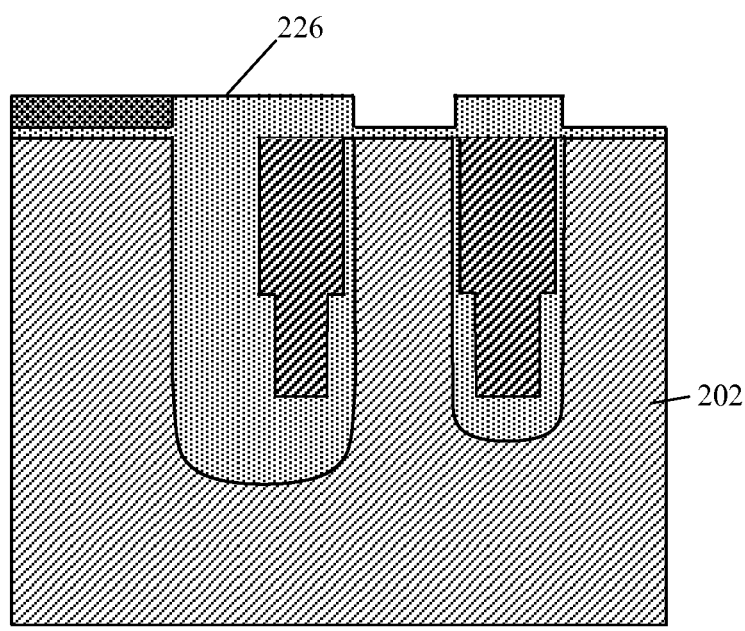

In embodiments of the present invention, the fabrication process for the power MOSFET continues to complete the transistor device. FIGS. 3(j) to 3(m) illustrate the remaining processing steps to complete the power MOSFET device in some examples of the present invention. Referring to FIG. 3(j), nitride spacers 224 are formed adjacent the ONO hard mask layer 204 and over the polysilicon filled trenches. At the edge termination cell, the nitride spacer extends to the top of the HDP oxide layer above the ONO hard mask layer 204. Then, an oxide etch process is carried out to remove the top oxide layer of the ONO hard mask layer 204, as shown in FIG. 3(k).

Then, oxide deposition is performed to deposit an oxide layer 226 on the semiconductor structure of FIG. 3(k). Then the structure is planarization to the top of the silicon nitride layer in the ONO hard mask layer 204. The nitride layer in the ONO hard mask above the mesa is then removed, resulting in the structure shown in FIG. 3(l). In one embodiment, the polysilicon cover mask used in the oxide etch processing step is applied here again to cover the edge termination cells while exposing the active cell mesas for the nitride strip process.

Figure 3M:
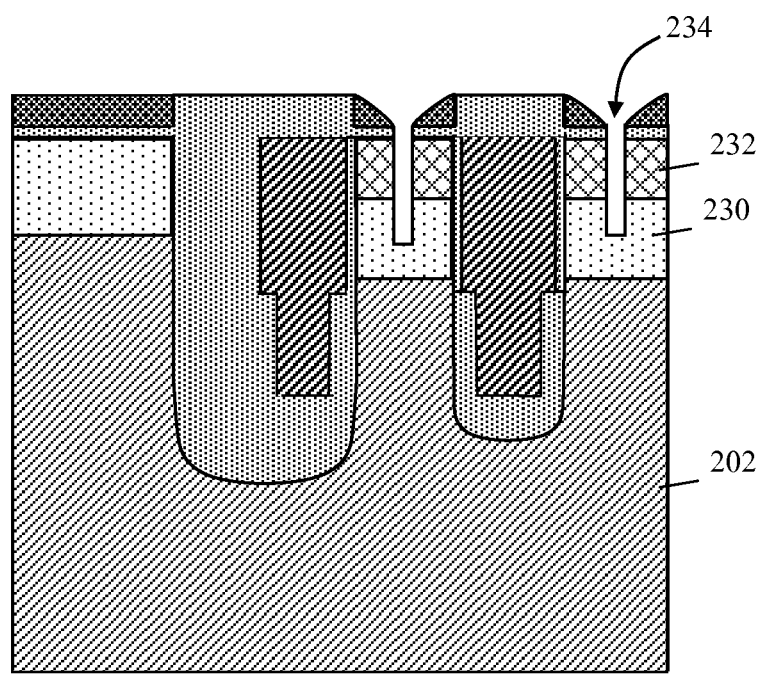

Finally, a well ion implantation process is carried out to form a doped region in the active cell mesa to function as the body region 230 of the power MOSFET. In the present illustration, the well implant is a P-type implant. A source ion implantation process is carried out to form a doped region in the active cell mesa to function as the source region 232 of the power MOSFET. In the present illustration, the source implant is an N-type implant. After the source and body regions are formed, an insulating layer is deposited onto the semiconductor structure and contacts to the source region 232 and body region 230 are then formed. Various processes can be used to form the source and body contacts. In the example shown in FIG. 3(m), a self-aligned process is used to form the source/body contact 234. FIG. 3(m) illustrates the power MOSFET formed using the dual oxide thickness gate trench structure according to embodiments of the present invention.

Alternate Embodiments

In the above described embodiments, a silicon nitride layer is used to form the spacers for etching the oxide trench in the oxide layer 212. In other embodiments, the spacers can be formed using other dielectric materials, such as silicon oxide.

Figure 4:
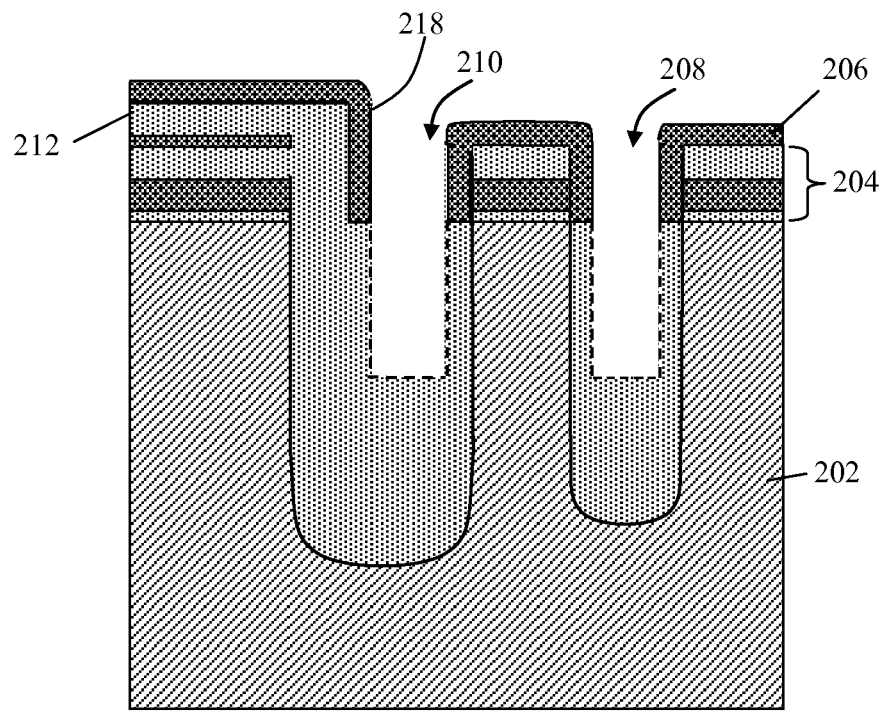
FIG. 4 is a cross-sectional view of a single oxide thickness trench structure formed using the trench oxide etch method according to an alternate embodiment of the present invention.

In the above description, the method for forming a dual oxide thickness trench gate structure in a power MOSFET uses a nitride spacer formed in a trench partially filled with an oxide layer to etch the oxide layer. The method can be referred to as a trench oxide etch method as the oxide layer in the trench is etched against a nitride spacer. By using a partially filled trench, a dual oxide thickness trench structure is formed. In other embodiments of the present invention, the method can be applied to form a trench structure with a single oxide thickness. FIG. 4 is a cross-sectional view of a single oxide thickness trench structure formed using the trench oxide etch method according to an alternate embodiment of the present invention. Referring to FIG. 4, to form a trench with a single oxide thickness, the trenches 208 and 210 are filled with an oxide layer 212 and the oxide layer is etched to the top of the trenches only. Then, the nitride spacer 218 is formed along the side of the ONO hard mask layer 206 and the first nitride cap layer 206. Then, the exposed oxide layer 212 can be etched to form a liner oxide layer in the trenches having a single oxide thickness throughout the trenches.

Figure 5:
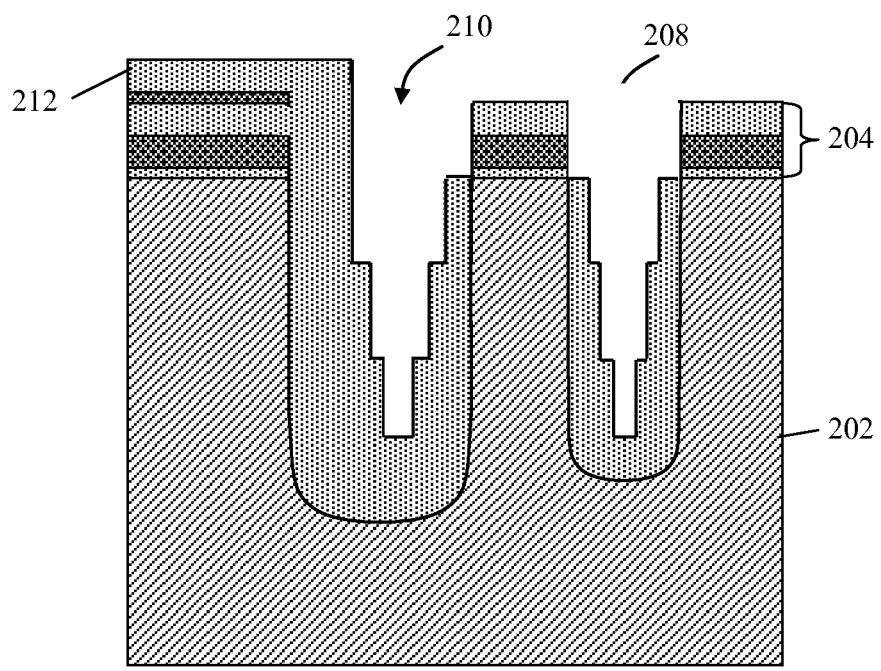
FIG. 5 is a cross-sectional view of a multi-oxide thickness trench structure formed using the trench oxide etch method according to an alternate embodiment of the present invention.

Alternately, the trench oxide etch method of the present invention can be applied to form trench structures with multiple oxide thicknesses. FIG. 5 is a cross-sectional view of a multi-oxide thickness trench structure formed using the trench oxide etch method according to an alternate embodiment of the present invention. Referring to FIG. 5, the nitride spacer and oxide etch process is repeated one or more times to form a staggered oxide structure in the trenches 208, 210.

In yet other embodiments of the present invention, the trench oxide etch method can be used to form dummy trenches that are either oxide filled or polysilicon filled.

Lastly, in some embodiments, a Schottky diode can be formed by omitting the body and source implants and overlaying the mesas with a Schottky metal.

The trench oxide etch method of the present invention provides many advantages. First, because the liner oxide is formed by masking and etching instead of thermal oxidation, the method provides greater control of the thickness of the liner oxide. The liner oxide thickness is controlled by the thickness of the nitride spacer layer. Second, by using an etch process to form the liner oxide instead of an oxidation process used in the conventional processes, the thermal budget for the entire device is reduced. Third, the edge trench structure is self-terminating. By using masking, a thick oxide is formed automatically at the edge termination cells. Edge termination is provided without additional processing steps.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method for forming a dual oxide thickness trench gate structure including a termination structure for a power MOSFET, comprising:
   providing a semiconductor substrate;
   forming a hard mask layer on the semiconductor substrate;
   forming a first dielectric cap layer on the hard mask layer;
   patterning the hard mask layer and the first dielectric cap layer to define a first trench being an active trench and a second trench being a termination trench, the second trench being formed along an edge of the semiconductor substrate to form the termination structure;
   forming, using the hard mask layer and the first dielectric cap layer as a mask, the first trench and the second trench on a top surface of the substrate, the second trench having a width wider than a width of the first trench and having a depth deeper than a depth of the first trench;
   forming a first oxide layer on the semiconductor substrate and filling the first trench and the second trench, the first oxide layer being formed on the patterned first dielectric cap layer and the hard mask layer;
   forming a second dielectric cap layer on the first oxide layer;
   patterning the second dielectric cap layer to define areas for forming the trench gate structure comprising patterning the second dielectric cap layer to expose at least areas including an entire opening of the first trench and an inner portion of an opening of the second trench away from the edge of the semiconductor substrate, an outer portion of the opening of the second trench being covered by the second dielectric cap layer;
   etching, using the second dielectric cap layer as a mask, a portion of the first oxide layer in the first trench and the second trench, the first oxide layer being removed from a top portion of the first trench and remaining only in a bottom portion of the first trench, the bottom portion of the first oxide layer in the first trench having a first depth from a bottom of the first trench, and the first oxide layer being removed from a top portion of the inner portion of the second trench and remaining in a bottom portion of the second trench and an outer sidewall portion of the second trench forming a sidewall oxide portion, the sidewall oxide portion being masked from etching by the second dielectric cap layer and lining an outer edge of an entire depth of the second trench;
   forming dielectric spacers along sidewalls of the first trench and the second trench and on the first oxide layer formed in the respective first and second trenches, the dielectric spacers being formed on the sidewall oxide portion in the second trench;
   etching, using the dielectric spacers as a mask, the first oxide layer in the first trench and the second trench to a second depth from the bottom of the first trench, the second depth being lower than the first depth;
   removing the dielectric spacers; and
   forming a second oxide layer along the sidewall of the first trench above the first oxide layer and at least along the sidewall of an inner edge of the second trench, the second oxide layer having a thickness thinner than a thickness of the first oxide layer.

2. The method of claim 1, further comprising:
   forming a polysilicon layer in the first trench and the second trench, the polysilicon layer forming a trench gate of the power MOSFET in the first trench and in the inner edge of the second trench, the second oxide layer comprising a gate oxide layer and the first oxide layer comprising a liner oxide layer.

3. The method of claim 2, wherein forming a first oxide layer on the semiconductor substrate and filling the first trench and the second trench comprises depositing the first oxide layer on the semiconductor substrate and in the first and second trenches; and forming a second oxide layer along the sidewall of the first trench above the first oxide layer and at least along the sidewall of an inner edge of the second trench comprises performing thermal oxidation to form the second oxide layer along the sidewall of the first trench above the first oxide layer and at least along the sidewall of the inner edge of the second trench.

4. The method of claim 3, wherein depositing the first oxide layer on the semiconductor substrate and in the first and second trenches comprises depositing a high density plasma oxide layer on the semiconductor substrate and in the first and second trenches.

5. The method of claim 1, wherein forming a hard mask layer on the semiconductor substrate comprises forming a silicon nitride layer sandwiched between two silicon oxide layers as the hard mask layer; and forming a first dielectric cap layer on the hard mask layer comprises forming a first silicon nitride cap layer on the hard mask layer.

6. The method of claim 1, wherein forming a second dielectric cap layer on the first oxide layer comprises forming a second silicon nitride cap layer on the first oxide layer.

7. The method of claim 1 wherein forming dielectric spacers along the sidewalls of the first trench and the second trench and on the first oxide layer comprises:
  forming silicon nitride spacers along the sidewalls of the first trench and the second trench and on the first oxide layer.

8. The method of claim 2, further comprising:
  forming a body region in the silicon substrate adjacent to the first trench and the inner edge of the second trench;
  forming a source region in the body region; and
  forming a contact to the body region and the source region.

* * * * *